United States Patent
Lee et al.

(10) Patent No.: US 10,909,467 B2
(45) Date of Patent: Feb. 2, 2021

(54) EM SENSOR AND MOBILE DEVICE INCLUDING THE SAME

(71) Applicant: SAMSUNG ELECTRONICS CO., LTD., Suwon-si (KR)

(72) Inventors: Seung Jae Lee, Hwaseong-si (KR); Myoung Oh Ki, Seongnam-si (KR); Long Yan, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 149 days.

(21) Appl. No.: 16/243,854

(22) Filed: Jan. 9, 2019

(65) Prior Publication Data

US 2019/0370678 A1 Dec. 5, 2019

(30) Foreign Application Priority Data

Jun. 1, 2018 (KR) .................. 10-2018-0063630

(51) Int. Cl.
*G06N 7/00* (2006.01)
*G01R 29/08* (2006.01)
*G06F 1/26* (2006.01)

(52) U.S. Cl.
CPC ......... *G06N 7/005* (2013.01); *G01R 29/0892* (2013.01); *G06F 1/266* (2013.01)

(58) Field of Classification Search
CPC .... G06N 7/005; G01R 29/0892; G06F 1/266; G06F 1/1698
See application file for complete search history.

(56) References Cited

U.S. PATENT DOCUMENTS

| | | | |
|---|---|---|---|
| 6,225,986 B1 | 5/2001 | Sato et al. | |
| 2002/0163346 A1* | 11/2002 | Arndt | G01V 3/104 |
| | | | 324/639 |
| 2005/0078093 A1 | 4/2005 | Peterson, Jr. et al. | |
| 2011/0080349 A1 | 4/2011 | Holbein et al. | |
| 2011/0080367 A1 | 4/2011 | Marchand et al. | |
| 2013/0022214 A1 | 1/2013 | Dickins et al. | |
| 2013/0176270 A1 | 7/2013 | Cattivelli et al. | |
| 2014/0075226 A1* | 3/2014 | Heo | G06F 1/3293 |
| | | | 713/323 |
| 2015/0012767 A1* | 1/2015 | Levy | G06F 1/324 |
| | | | 713/322 |
| 2015/0199045 A1 | 7/2015 | Robucci et al. | |
| 2015/0346895 A1 | 12/2015 | Bokma et al. | |
| 2016/0012348 A1 | 1/2016 | Johnson et al. | |
| 2016/0181857 A1* | 6/2016 | Konanur | G06F 1/1698 |
| | | | 320/108 |
| 2016/0259432 A1 | 9/2016 | Bau et al. | |
| 2016/0259451 A1 | 9/2016 | Hau et al. | |
| 2016/0261268 A1* | 9/2016 | Rakova | G06N 7/005 |
| 2017/0309232 A1 | 10/2017 | Joo et al. | |

\* cited by examiner

*Primary Examiner* — Mohamed Barakat
(74) *Attorney, Agent, or Firm* — Volentine, Whitt & Francos, PLLC

(57) ABSTRACT

An electromagnetic (EM) sensor includes a front-end module, a memory, and a microcontroller unit. The front-end module generates an electromagnetic signal using externally introduced electromagnetic waves. The memory stores a first reference signal and a second reference signal generated from multiple probability models required to recognize the electromagnetic signal. The microcontroller unit compares the electromagnetic signal with the first reference signal and the second reference signal, to determine whether the electromagnetic signal is a valid signal.

20 Claims, 17 Drawing Sheets

EM SENSOR AND MOBILE DEVICE INCLUDING THE SAME

CROSS-REFERENCE TO RELATED APPLICATION(S)

This U.S. non-provisional patent application claims priority under 35 U.S.C. § 119 to Korean Patent Application No. 10-2018-0063630, filed on Jun. 1, 2018 in the Korean Intellectual Property Office, the disclosure of which is incorporated herein by reference in its entirety.

BACKGROUND

1. Technical Field

The present disclosure relates to an electromagnetic (EM) sensor and a mobile device including the same.

2. Description of Related Art

Electromagnetic (EM) sensors are sensors that can be used for recognizing and/or classifying electronic devices, using electromagnetic waves emitted by such electronic devices. Characteristics of electromagnetic waves may vary for electronic devices having different components in to internal circuits, clock signals used in operations, and the like. Resultingly, the electronic devices may be recognized based on the electromagnetic waves emitted by the electronic devices. That is, the electronic devices may be recognized based on the characteristics of electromagnetic waves emitted by the electronic devices and received by the EM sensors. Generally, EM sensors may perform processes of receiving electromagnetic waves to generate electromagnetic signals (EM signals) and extracting feature values of the electromagnetic signals, and the like. A process of recognizing electronic devices may be performed by separate main processors connected to the EM sensors based on the feature values extracted from the electromagnetic signals by the EM sensors.

SUMMARY

The present disclosure provides an EM sensor and a mobile device that includes the EM sensor. Consumed power in the EM sensor and a calculation burden of a main processor may be reduced by the EM sensor determining whether or not to transmit an electromagnetic signal to the main processor by determining validity of the electromagnetic signal.

According to an aspect of the present disclosure, an electromagnetic (EM) sensor includes a front-end module, a memory, and a microcontroller. The front-end module is configured to generate an electromagnetic signal, using electromagnetic waves introduced externally (i.e., from an external sensor). The memory is configured to store a first reference signal and a second reference signal, generated from multiple probability models required to recognize the electromagnetic signal. The microcontroller unit is configured to compare the electromagnetic signal with the first reference signal and the second reference signal, to determine whether the electromagnetic signal is a valid signal.

According to an aspect of the present disclosure, an EM sensor includes a front-end module, a memory, and a microcontroller unit. The front-end module is configured to generate an electromagnetic signal from an externally introduced electromagnetic wave (i.e., an electromagnetic wave introduced from an external source). The memory is configured to store a first envelope and a second envelope generated from multiple probability models required to recognize the electromagnetic signal. The microcontroller unit is configured to calculate a ratio of an envelope of the electromagnetic signal located between the first envelope and the first envelope in a frequency domain, and output a signal for an external main processor to enter a wakeup mode when the ratio is greater than a predetermined threshold value.

According to an aspect of the present disclosure, a mobile device includes an EM sensor, a main processor and a storage. The EM sensor is configured to compare an envelope of an electromagnetic signal, corresponding to an electromagnetic wave introduced externally, with a first envelope and a second envelope, to determine whether the electromagnetic signal is a valid signal. The EM sensor is also configured to extract feature values of the electromagnetic signal when the electromagnetic signal is a valid signal. The main processor is configured to enter a wakeup mode in response to a signal from the EM sensor when the EM sensor determines that the electromagnetic signal is a valid signal. The main processor is also configured to recognize an electronic device from which the electromagnetic wave was emitted, using the feature values of the electromagnetic signal. The storage is configured to store multiple probability models required to recognize the electronic device.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
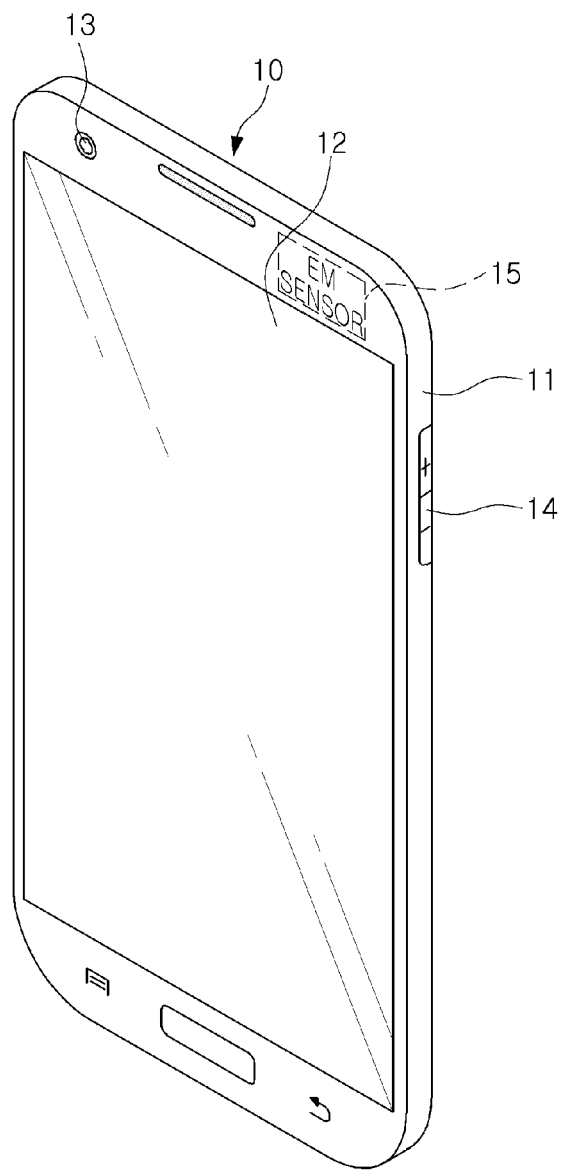
FIG. 1 is a schematic perspective view illustrating a mobile device according to an example embodiment of the present disclosure.

FIG. 1 is a schematic perspective view illustrating a mobile device according to example embodiment.

Referring to FIG. 1, a mobile device 10 may include a housing 11, a display 12, a camera module 13, an input unit 14, and an EM sensor 15 (electromagnetic sensor). In the example embodiment illustrated in FIG. 1, although the mobile device 10 is illustrated as a smartphone, examples of the mobile device 10 may include various mobile devices such as a tablet PC, a laptop computer or the like, or a wearable device such as a smartwatch or the like. That is, a mobile device 10 is representative of a wide variety of mobile electronic devices that can implement the EM sensor 15.

The EM sensor 15 may be mounted in an interior of the mobile device 10. The EM sensor 15 may include a front-end module, a microcontroller unit and the like. The front-end module may receive an electromagnetic wave in a specific frequency band to convert the received electromagnetic wave into an electromagnetic signal. The microcontroller unit may extract from the electromagnetic signal feature values to recognize an electronic device that emitted the electromagnetic wave. The front-end module may include an antenna, an analog circuit and the like. The antenna and analog circuit may receive the electromagnetic wave to convert the received electromagnetic wave into an analog signal. In an example embodiment, the front-end module of the EM sensor 15 may also share an antenna with a wireless communication module in a smartphone.

In FIGs. herein including FIG. 1, circuitry may be shown as or described as, for example, a "unit" such as a "sensor unit" and a "microcontroller unit", a "module" such as a "front-end module", and a "processor". As is traditional in the field of the inventive concept(s) described herein, examples may be described and illustrated in terms of blocks which carry out a described function or functions. These blocks, which may be referred to herein as a unit, a module, and a processor, or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the inventive concepts. Likewise, the blocks of the examples may be physically combined into more complex blocks without departing from the scope of the inventive concepts.

Figure 2:
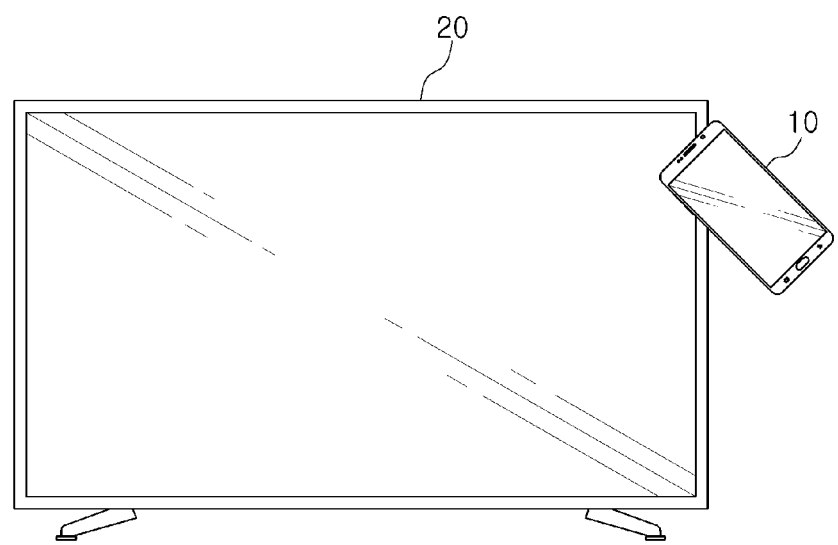
FIG. 2 is a view illustrating operations of a mobile device according to an example embodiment of the present disclosure.

FIG. 2 is a view provided to illustrate operations of a mobile device according to an example embodiment.

Referring to FIG. 2, a user of the mobile device 10 equipped with the EM sensor 15 may approach or contact the mobile device 10 with an electronic device 20 emitting electromagnetic waves. Since electronic devices such as the electronic device 20 generally emit electromagnetic waves, electromagnetic waves may be accurately detected by bringing the mobile device 10 as close as possible to or into contact with the electronic device 20 from which the electromagnetic waves are to be detected, using the EM sensor 15.

When the mobile device 10 approaches or contacts the electronic device 20, the EM sensor 15 may receive electromagnetic waves emitted by the electronic device 20 and thus recognize the type and model name of the electronic device 20 and the like. The electronic device 20 may emit electromagnetic waves inherent thereto, determined by an electrical signal, such as a clock signal or the like, used by an internal circuit as a component used therein. The EM sensor 15 may recognize the electronic device 20 emitting the electromagnetic wave by extracting feature values of the electromagnetic wave and applying the extracted feature values to a predetermined probability model.

In FIG. 2, the electronic device 20 is shown as a display such as a television. However, the electronic device 20 may be any of a variety of types of electronic devices that emit electromagnetic waves, even when the emitted electromagnetic waves are not emitted as a primary or intended function of the electronic devices. Examples of the electronic device 20 include televisions, monitors and other displays, radios, computers, smartphones and other telephones, tablets, refrigerators, washing machines, microwaves, audiovisual receivers, printers, wearable devices and more.

Figure 3:
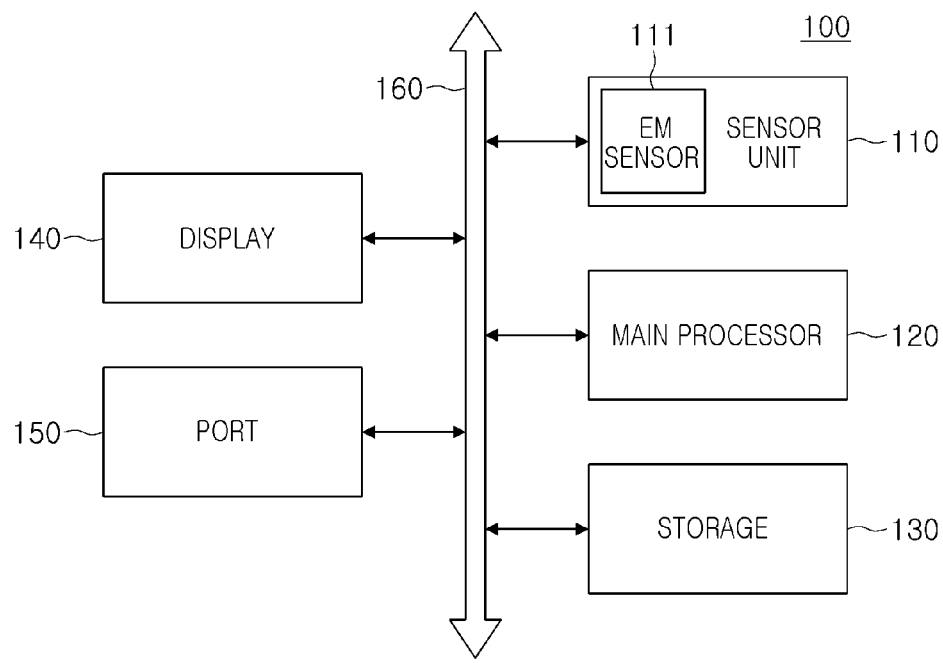
FIGS. 3 and 4 are schematic block diagrams illustrating mobile devices according to example embodiments of the present disclosure.
Figure 4:
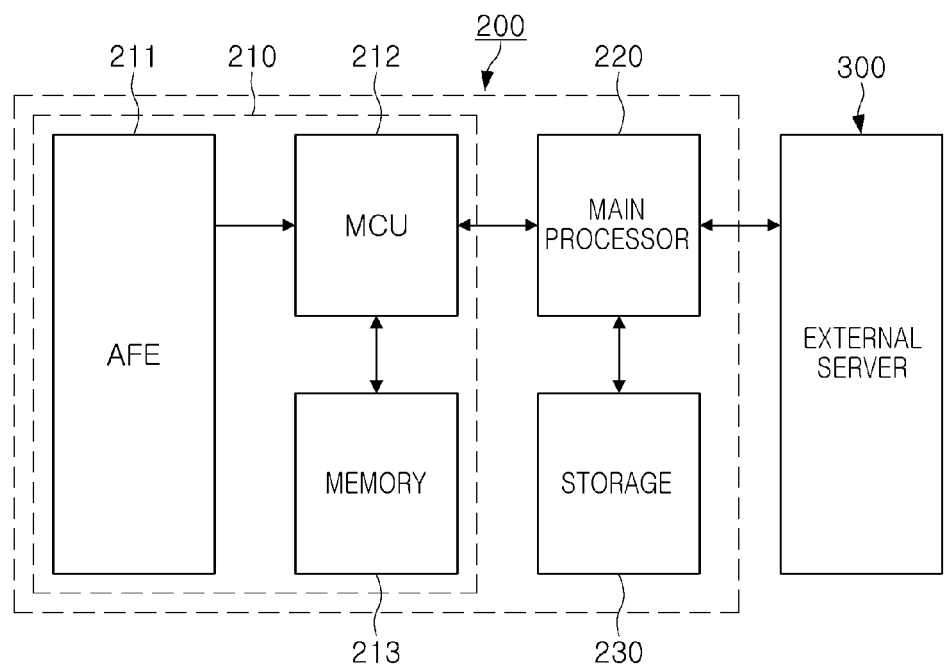

FIGS. 3 and 4 are schematic block diagrams illustrating mobile devices according to example embodiments.

Referring to FIG. 3, a mobile device 100 according to an example embodiment may include a sensor unit 110, a main processor 120, a storage 130, a display 140, a port 150 and the like. In addition, the mobile device 100 may further include a wired/wireless communication device, a power supply device, and the like. Among the components illustrated in FIG. 3, the port 150 may be a device through which the mobile device 100 is to communicate with a video card, a sound card, a memory card, a USB device, and the like. The mobile device 100 may be a device such as a smartphone, a tablet PC, a wearable device, a laptop computer, various other electronic devices, and the like.

The main processor 120 may perform specific arithmetic operations, commands, tasks and the like. The main processor 120 may be provided in the form of a central processing unit (CPU), a system-on-chip (SoC) or the like, and may communicate with other devices connected to the port 150, as well as the sensor unit 110, the storage 130 and the display 140, via a system bus 160.

The sensor unit 110 may include an EM sensor 111. The EM sensor 111 may include a front-end module receiving an externally received electromagnetic wave to convert the electromagnetic wave into a signal, a microcontroller unit processing the signal, a memory, and the like. The microcontroller unit of the EM sensor 111 may extract feature values of the electromagnetic signal generated from the electromagnetic wave by the front-end module. The main processor 120 may recognize an electronic device from which the electromagnetic wave was emitted by applying the feature values to a predetermined probability model.

For example, when the EM sensor 111 extracts feature values from a signal generated by receiving an electromagnetic wave and the main processor 120 performs an arithmetic operation of applying the feature values to the probability model, the main processor 120 may operate whenever the electromagnetic waves are introduced externally. The main processor 120 may operate in either a sleep mode or a wakeup mode, to efficiently manage a battery supplying power to the mobile device 100. For example, if the EM sensor 111 always receives electromagnetic waves and extracts feature values regardless of an operating mode of the main processor 120, whenever the electromagnetic waves are received externally, the main processor 120 may enter the wakeup mode by the EM sensor 111. The power consumption of the main processor 120 increases in the wakeup mode, and as a result, the usage time of the entirety of the mobile device 100 may be reduced. Nevertheless, the power consumption of the main processor 120 is reduced by the ability to enter the sleep mode, such as when the EM sensor 111 is not receiving electromagnetic waves.

In the case in which a user may directly control on/off operations of the EM sensor 111, the main processor 120 may be switched to the wakeup mode only when the user turns on the EM sensor 111 to receive electromagnetic waves. A probability model may be applied to characteristics extracted from the electromagnetic waves. Thus, when the user may directly control the on/off operations of the EM sensor 111, consumed power of the main processor 120 may be reduced. However, whenever the EM sensor 111 receives electromagnetic waves, the operation of applying the feature values extracted from the electromagnetic waves to the probability model should be executed by the main processor 120, which may lead to a calculation burden of the main processor 120.

In an example embodiment, the EM sensor 111 may generate an electromagnetic signal from an electromagnetic wave and compare the electromagnetic signal with a predetermined first reference signal and a predetermined second reference signal to determine the validity of the electromagnetic signal. The first reference signal and the second reference signal may be stored in a memory in the EM sensor 111. For example, the main processor 120 may generate the first reference signal and the second reference signal to store the generated reference signals in an internal memory of the EM sensor. Thus, the operation, in which the EM sensor 111 compares the electromagnetic signal with the first reference signal and the second reference signal to determine the validity of the electromagnetic signal, may be performed without the intervention of the main processor 120.

The EM sensor 111 may transmit the electromagnetic signal and/or feature values of the electromagnetic signal to the main processor 120 when the electromagnetic signal is determined to be valid. Since the electromagnetic signal and/or the feature values of the electromagnetic signal are transmitted to the main processor 120 only when the validity thereof is verified by the EM sensor 111, consumed power and calculation burden of the main processor 120 may be reduced.

Then, referring to FIG. 4, a mobile device 200 according to an example embodiment may include an EM sensor 210, a main processor 220, a storage 230, and the like. The EM sensor 210 may include a front-end module 211, a microcontroller unit 212 (MCU), and a memory 213. The memory 213 may be a storage device packaged in the EM sensor 210 and may include a static random-access memory (SRAM), a flash memory, and the like.

The front-end module 211 may be a circuit that converts an externally introduced electromagnetic wave into a signal, and may include an antenna, a mixer, a filter, a signal amplifier, an analog-to-digital converter, and the like. In an example, the front-end module 211 may generate an electromagnetic signal by receiving a signal in a predetermined frequency band, for example, 3 MHz or less, as an electromagnetic wave. The electromagnetic signal generated by the front-end module 211 may be transmitted to the microcontroller unit 212.

The microcontroller unit 212 may extract feature values of the electromagnetic signal to transmit the extracted feature values to the main processor 220. The main processor 220 may recognize an electronic device from which the electromagnetic wave corresponding to the electromagnetic signal was emitted, using the feature values of the electromagnetic signal and multiple probability models stored in the storage 230. The probability models stored in the storage 230 may include a Gaussian Mixture Model (GMM), and the main processor 220 may input the feature values of the electromagnetic signal to the probability models to recognize the electronic device from which the electromagnetic waves were emitted. The main processor 220 may receive multiple probability models from an external server 300 and may store the received probability models in the storage 230. The storage 230 stores all or a portion of the probability models stored in the external server 300, to recognize the electronic device using feature values extracted from the electromagnetic signal and the portion of the probability models stored in the storage 230. In an example embodiment, the main processor 220 may be connected to the external server 300 in every predetermined interval to check whether the probability models are updated. The main processor 220 may update the probability models stored in the storage 230.

In an embodiment, the external server 300 may provide a cloud service to provide the probability models to the main processor 220. The main processor 220 receives the probability models from the external server 300 providing the cloud service. The main processor 220 then stores the probability models in the storage, and the probability models may be all or a portion of the probability models available from the cloud service provided by the external server 300.

In an example embodiment, the microcontroller unit 212 may compare the electromagnetic signal to a first reference signal and a second reference signal stored in the memory 213, to determine whether the electromagnetic signal is valid, before transmitting the feature values of the electromagnetic signal to the main processor 220. The main processor 220 may generate the first reference signal and the second reference signal to store the generated first reference signal and second reference signal in the memory 213, using the probability models stored in the storage 230. In an example, the main processor 220 may determine multiple reference frequencies in a frequency domain, generate a first reference signal using an envelope connecting minimum values of the probability models at reference frequencies, and generate a second reference signal, using an envelope connecting maximum values of the probability models at reference frequencies.

The microcontroller unit 212 may determine the validity of the electromagnetic signal, depending on whether the envelope of the electromagnetic signal is located between the envelope of the first reference signal and the envelope of the second reference signal. For example, the microcontroller unit 212 may calculate a ratio at which the envelope of the electromagnetic signal is located between the envelope of the first reference signal and the envelope of the second reference signal in a predetermined frequency band. The microcontroller unit 212 may compare the calculated ratio with a predetermined threshold value, thereby determining the validity of the electromagnetic signal. For example, when the ratio, at which the envelope of the electromagnetic signal is located between the envelopes of the first reference signal and the second reference signal in the frequency band, is calculated as 95%, and the threshold value is 90%, the electromagnetic signal may be determined to be a valid signal.

In an example embodiment, to increase the accuracy of the validity determination, the electromagnetic signal may be divided into multiple frequency bands, and the envelope of the electromagnetic signal may be compared to the envelopes of the first reference signal and the second reference signal. In an example, the microcontroller unit 212 may divide the electromagnetic signal into a first frequency band, a second frequency band, and a third frequency band, and may calculate scores for the envelopes of the electromagnetic signal located between the envelopes of the first reference signal and second reference signal in the respective first frequency band, second frequency band and third frequency band, based on the ratios thereof. The microcontroller unit 212 may compare the sum or average of the scores with a predetermined threshold value, to determine the validity of the electromagnetic signal.

For example, when the electromagnetic signal is determined to be a valid signal, the microcontroller unit 212 may transmit the electromagnetic signal or feature values of the electromagnetic signal to the main processor 220. When the electromagnetic signal is determined to be a valid signal and the main processor 220 is determined to be in a sleep mode, the microcontroller unit 212 may output a signal to the main processor 220, the signal being to enable the main processor 220 to enter a wakeup mode. The signal may be output, prior to generation of the electromagnetic signal or extraction of the feature values of the electromagnetic signal, or may be output together therewith.

For example, in an example embodiment, the main processor 220 may be switched to the wakeup mode only when the validity of the electromagnetic signal is verified by the microcontroller unit 212. Alternatively, a process in which the main processor 220 recognizes an electronic device using the electromagnetic signal may be executed only when the validity of the electromagnetic signal is verified by the microcontroller unit 212. Thus, power consumption and a calculation burden of the main processor 220 may be reduced, and the usability of the mobile device 200 may be improved.

Figure 5:
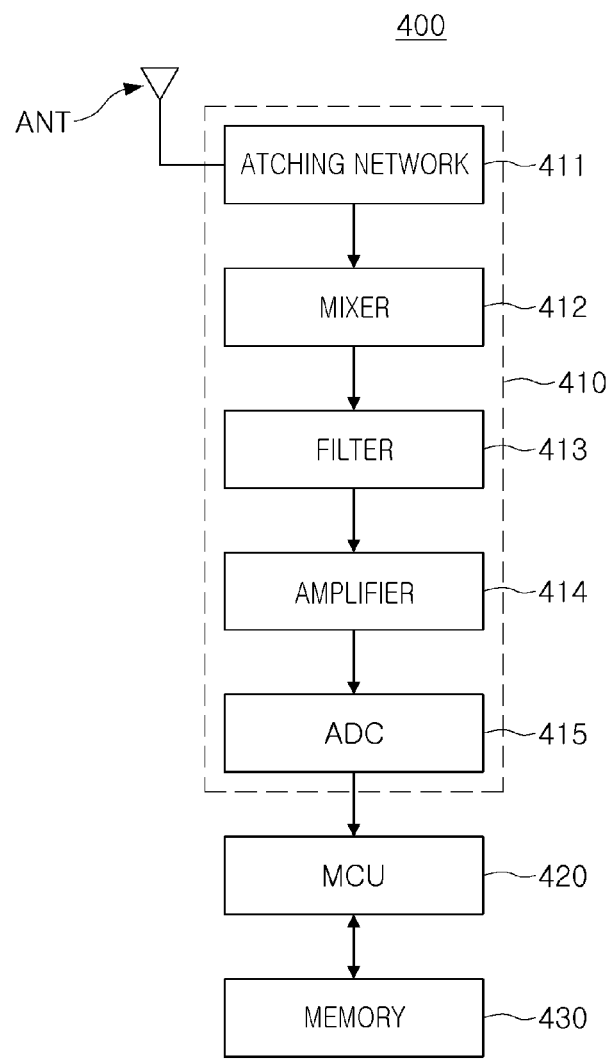
FIG. 5 is a schematic block diagram illustrating an EM sensor according to an example embodiment of the present disclosure.

FIG. 5 is a schematic block diagram illustrating an EM sensor according to an example embodiment.

Referring to FIG. 5, an EM sensor 400 according to an example embodiment may include a front-end module 410, a microcontroller unit 420, a memory 430, and the like. The front-end module 410 may include an antenna ANT, a matching network 411, a mixer 412, a filter 413, an amplifier 414, an analog-to-digital converter 415 (ADC), and the like. The configuration of the front-end module 410 is not limited to the features illustrated in FIG. 5. Rather, the front-end module 410 may include various modifications.

For example, when the antenna ANT receives an electromagnetic wave and converts the received electromagnetic wave into an analog signal, a frequency of the analog signal may be converted by the matching network 411 and the mixer 412. The filter 413 may be a circuit to remove a noise component, and may include, for example, a high-pass filter or a band-pass filter. The amplifier 414 may be a variable gain amplifier capable of adjusting a gain and may amplify the output of the filter 413 to generate an electromagnetic signal. The analog-to-digital converter 415 may convert the electromagnetic signal to a digital signal.

The microcontroller unit 420 may receive the electromagnetic signal to compare the received electromagnetic signal with reference signals stored in the memory 430. For example, the memory 430 may store a first reference signal and a second reference signal, and the microcontroller unit 420 may compare an envelope of the electromagnetic signal with envelopes of the first reference signal and the second reference signal, to determine validity of the electromagnetic signal. The microcontroller unit 420 may determine the validity of the electromagnetic signal, using the ratio of the envelope of the electromagnetic signal located between the envelope of the first reference signal and the envelope of the second reference signal. As described above, to improve the accuracy of the validity determination, the electromagnetic signal may be divided into multiple frequency bands, and a score according to a ratio at which the envelope of the electromagnetic signal is located between the envelope of the first reference signal and the envelope of the second reference signal in each of the frequency bands, may be calculated, thereby determining the validity of the electromagnetic signal.

On the other hand, when the front-end module 410 generates multiple electromagnetic signals at the same time, the microcontroller unit 420 may select one of the different electromagnetic signals as a selected electromagnetic signal to verify the validity thereof. In an example, the microcontroller unit 420 may determine the strength of the electromagnetic signals, based on a signal-to-noise ratio or the like, and may select the electromagnetic signal having a relatively greatest intensity to first verify the validity thereof.

Figure 6:
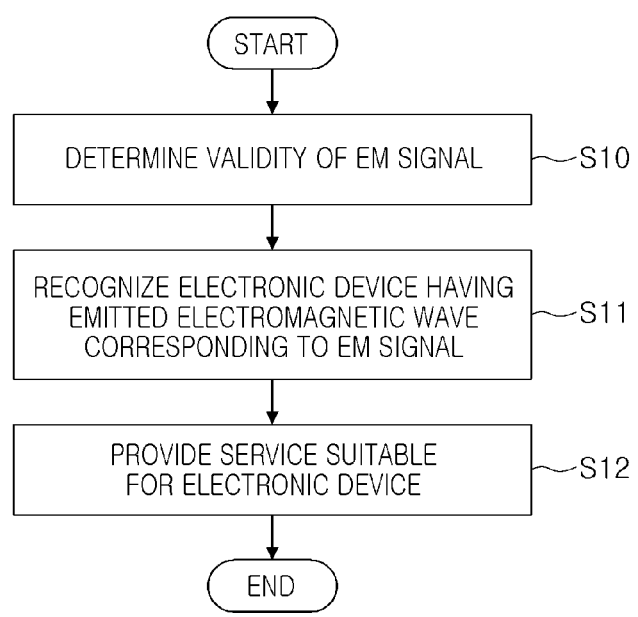
FIG. 6 is a flowchart illustrating operations of a mobile device according to an example embodiment of the present disclosure.

FIG. 6 is a flowchart illustrating an operation of a mobile device according to an example embodiment.

Referring to FIG. 6, the operation of the mobile device according to an example embodiment may be started by determining the validity of an electromagnetic signal by an EM sensor mounted on a mobile device, in S10. As described above, a first reference signal and a second reference signal to determine the validity of the electromagnetic signal may be stored in an internal memory of the EM sensor. The EM sensor may determine the validity of the electromagnetic signal by comparing an envelope of the electromagnetic signal with envelopes of the first reference signal and the second reference signal. The EM sensor may only transmit the electromagnetic signal and/or feature values extracted from the electromagnetic signal to a main processor when the validity of the electromagnetic signal is verified.

The main processor may recognize an electronic device from an electromagnetic wave corresponding to the electromagnetic signal was emitted, using the validated electromagnetic signal in S11. The EM sensor may generate the electromagnetic signal from an externally introduced electromagnetic wave, to verify validity of the electromagnetic signal, and the main processor may recognize the electronic device from which the electromagnetic wave was emitted, using the electromagnetic signal. For example, the main processor may recognize the electronic device that has emitted the electromagnetic wave, using a predetermined probability model and feature values extracted from the electromagnetic signal.

For example, when the electronic device is successfully recognized, the main processor may provide a service suitable for the electronic device in S12. For example, when the electronic device has a consumable item exchanged at a predetermined cycle, such as an air purifier, a water purifier, an air conditioner, or the like, the main processor may determine a consumable replacement period and the like of the electronic device to display the determined consumable replacement period on the display. Alternatively, based on information regarding the electronic device recognized from the electromagnetic signal, a service required to establish an object internet environment, and the like, may be provided.

That is, when the electronic device is successfully recognized, the main processor may execute a service application suitable for the electronic device based on successfully recognizing the electronic device. In the examples above, a consumer replacement period for a component or subsystem of (or relating to) the electronic device is determined and displayed (e.g., on the mobile device). However, numerous other types of service applications may be executed based on successfully recognizing an electronic device in the manner described herein. Indeed, operation of the electronic device may be enabled based solely on such a service application being executed, such that the EM sensors described herein can be used to update and re-enable a disabled electronic device. Many other types of functionality of electronic devices may be implemented based on the EM sensors described herein recognizing the electronic devices. Additionally, such functionality may be contingent on recognizing a predetermined relationship between the electronic device and the EM sensor, such as each belonging to the same user. Thus, the main processor may execute a service application for the electronic device based on a user account stored in an internal memory of the EM sensor and a storage of the mobile device coinciding with a user account registered in the electronic device.

FIGS. 7 to 11 are views illustrating operations of an EM sensor according to an example embodiment.

Figure 7:
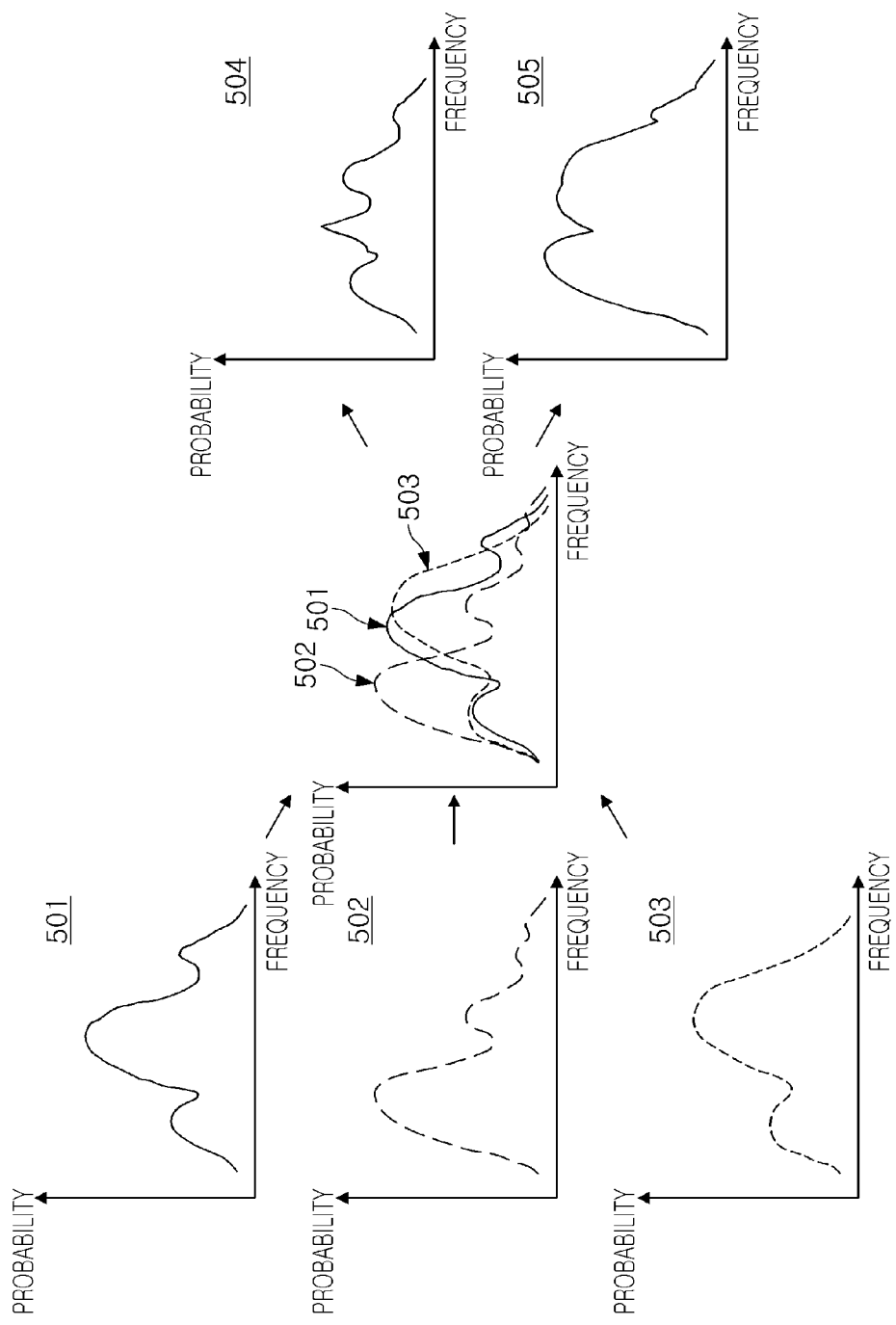
FIGS. 7 to 11 are views illustrating operations of an EM sensor according to an example embodiment of the present disclosure.

Referring to FIG. 7, probability models 501 to 503 used to recognize an electronic device from which the electromagnetic waves were emitted are illustrated for an example embodiment. The probability models 501 to 503 may be Gaussian mixture models. In the example embodiment illustrated in FIG. 7, three probability models 501 to 503 are shown for the sake of convenience. However, more probability models than the three probability models 501 to 503 shown in FIG. 7 may be stored in the storage of the mobile device.

The main processor of the mobile device may generate a first reference signal 504 and a second reference signal 505, using the probability models 501 to 503 stored in the storage. For example, the first reference signal 504 may be generated, based on a minimum value of the probability models 501 to 503 in the frequency band, and a second reference signal 505 may be generated, based on a maximum value of the probability models 501 to 503 in the frequency band.

The main processor may determine multiple reference frequencies in a frequency band in which the probability models 501 to 503 are defined, and may generate an envelope connecting minimum values of the probability models 501 to 503 to each other at multiple reference frequencies, to generate the first reference signal 504. Similarly, the main processor may generate an envelope connecting maximum values of the probability models 501 to 503 to each other at multiple reference frequencies to generate a second reference signal 505. Since the frequency band in which the probability models 501 to 503 are defined is a continuous section, for convenience of arithmetic operation, the main processor may first determine multiple reference frequencies in the frequency band, and may determine a minimum value and a maximum value of the probability models 501 to 503 to be connected to each other, in the respective frequencies, thereby generating the first reference signal 504 and the second reference signal 505. Thus, in the entirety of the frequency band, the first reference signal may always have a value less than the second reference signal.

The first reference signal 504 and the second reference signal 505 generated by the main processor may be stored in an internal memory of the EM sensor. The EM sensor may receive an electromagnetic wave externally, to convert the received electromagnetic wave into an electromagnetic signal, and may verify the validity of the electromagnetic signal by comparing the electromagnetic signal with the first reference signal 504 and the second reference signal 505. The EM sensor may switch the main processor to a wakeup mode only when the validity of the electromagnetic signal is verified. Alternatively, the EM sensor may transmit the electromagnetic signal and/or feature values of the electromagnetic signal to the main processor, thereby reducing consumed power and calculation burden of the mail processor. Hereinafter, a method of verifying validity of an electromagnetic signal, using the first reference signal 504 and the second reference signal 505, will be described with reference to FIGS. 8 to 11.

In an example embodiment, the EM sensor may include a memory storing the first reference signal 504 and the second reference signal 505, a front-end module that converts an electromagnetic wave into an electromagnetic signal, a microcontroller unit that verifies validity of the electromagnetic signal using the first reference signal 504 and the second reference signal 505, and the like. The verification of validity of the electromagnetic signal described with reference to FIGS. 8 to 11 may be executed by the microcontroller unit of the EM sensor.

Figure 8:
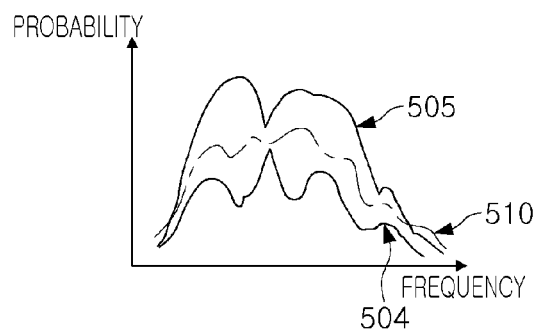
Figure 9:
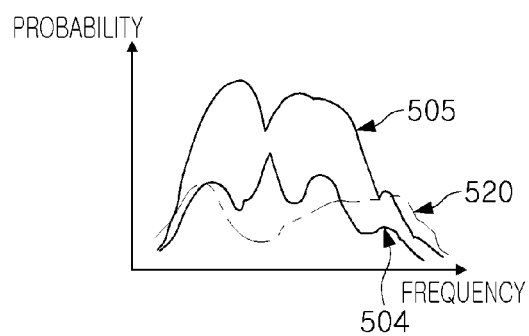

Referring to FIGS. 8 and 9, the microcontroller unit may compare an electromagnetic signal 510 with the first reference signal 504 and the second reference signal 505 stored in the memory. The microcontroller unit may calculate a ratio of the electromagnetic signal 510 that is greater than the first reference signal 504 and less than the second reference signal 505 in a frequency band in which the first reference signal 504 and the second reference signal 505 are defined. The microcontroller unit may verify the validity of the electromagnetic signal 510 by comparing the calculated ratio to a predetermined threshold value.

In an example, referring to FIG. 8, an envelope of the electromagnetic signal 510 may be located between an envelope of the first reference signal 504 and an envelope of the second reference signal 505 in most frequency bands. For example, in an example embodiment of FIG. 8, the ratio of the envelope of the electromagnetic signal 510 located between the envelope of the first reference signal 504 and the envelope of the second reference signal 505 may be greater than a predetermined threshold value. Thus, the microcontroller unit may determine that the electromagnetic signal 510 is a valid signal and may generate a signal to enable the main processor to enter a wakeup mode. In addition, the microcontroller unit may extract feature values of the electromagnetic signal 510 and may transmit the extracted feature values to the main processor.

Referring to FIG. 9, an envelope of an electromagnetic signal 520 may be smaller than the envelope of the first reference signal 504 or greater than the envelope of the second reference signal 505 in a relatively wide frequency band. For example, in an example embodiment of FIG. 9, a ratio of the envelope of the electromagnetic signal 520 located between the envelope of the first reference signal 504 and the envelope of the second reference signal 505 may be less than a predetermined threshold value. Thus, the microcontroller unit may determine that the electromagnetic signal 520 is an invalid signal, and thus, may not generate a signal to enable the main processor to enter the wakeup mode, or may not transmit the electromagnetic signal 520 or feature values of the electromagnetic signal 520 to the main processor. Thus, the consumed power and/or calculation burden of the main processor may be reduced.

Figure 10:
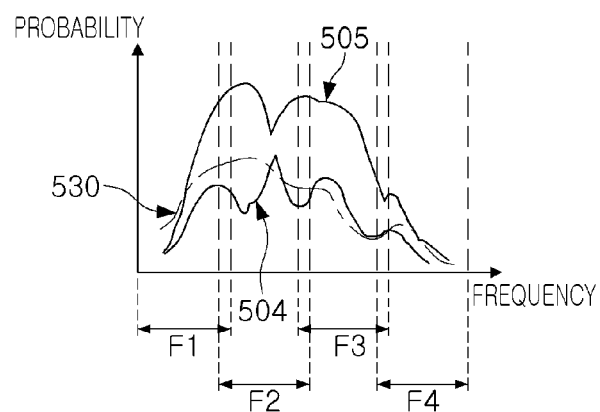

Referring to FIG. 10, the microcontroller unit may divide a frequency band in which the first reference signal 504 and the second reference signal 505 are defined, into multiple frequency bands F1 to F4. The microcontroller unit may calculate a ratio at which an envelope of an electromagnetic signal 530 is located between the envelopes of the first reference signal 504 and the second reference signal 505 in the respective frequency bands F1 to F4. The microcontroller unit may also determine the validity of the electromagnetic signal 530 using the ratio.

In an example, the microcontroller unit may calculate the ratio at which the envelope of the electromagnetic signal 530 is located between the envelopes of the first reference signal 504 and the second reference signal 505 in the respective frequency bands F1 to F4. The microcontroller unit may compare the ratio with threshold values. The threshold values may have the same value or different values in the frequency bands F1 to F4. For example, threshold values given to the first frequency band F1 and fourth frequency band F4, adjacent to a lowest frequency and a highest frequency, may be less than threshold values given to second and third frequency bands F2 and F3, intermediate bands.

The microcontroller unit may calculate the ratio at which the envelope of the electromagnetic signal 530 is located between the envelopes of the first reference signal 504 and the second reference signal 505 in the respective frequency bands F1 to F4. The microcontroller unit may compare the calculated ratio with a threshold ratio. Further, the microcontroller unit may provide a validity score to the respective frequency bands F1 to F4 according to a magnitude relation between the calculated ratio and the threshold ratio. In an example, when the calculated ratio is greater than the threshold ratio, the validity score may be determined to be '1,' and when the calculated ratio is less than the threshold ratio, the validity score may be determined to be '0.' The microcontroller unit may determine the validity of the electromagnetic signal 530 by comparing the sum or average of the validity scores calculated in the respective frequency bands F1 to F4 with a predetermined threshold. In another example embodiment, the microcontroller unit may calculate a ratio at which the envelope of the electromagnetic signal 530 is located between the envelopes of the first reference signal 504 and the second reference signal 505 in the respective frequency bands F1 to F4. The microcontroller unit may compare the average or sum of the ratios with a threshold value, thereby determining the validity of the electromagnetic signal 530.

In an example embodiment of FIG. 10, an envelope ratio of the electromagnetic signal 530 located between the envelopes of the first reference signal 504 and the second reference signal 505 may be greater than the threshold ratio in the first, second and fourth frequency bands F1, F2 and F4. Thus, the validity score in the first, second and fourth frequency bands F1, F2 and F4 may be calculated as '1,' and the validity score in the third frequency band F3 may be calculated as '0.' The microcontroller unit may determine that the electromagnetic signal 530 is a valid signal.

Figure 11:
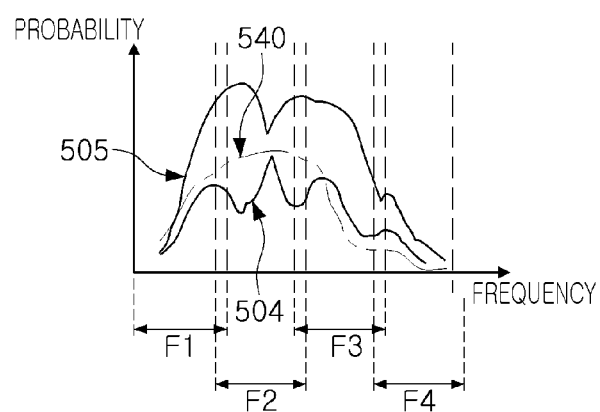

On the other hand, in an example embodiment illustrated in FIG. 11, an envelope ratio of an electromagnetic signal 540 located between the envelopes of the first reference signal 504 and the second reference signal 505 may be greater than a threshold ratio, only in the first frequency band F1 and second frequency band F2. Thus, the validity score may be calculated as '1' in the first frequency band and second frequency band F2, and the validity score may be calculated as '0' in the third and fourth frequency bands F3 and F4. The microcontroller unit may determine that the electromagnetic signal 540 is invalid.

Figure 12:
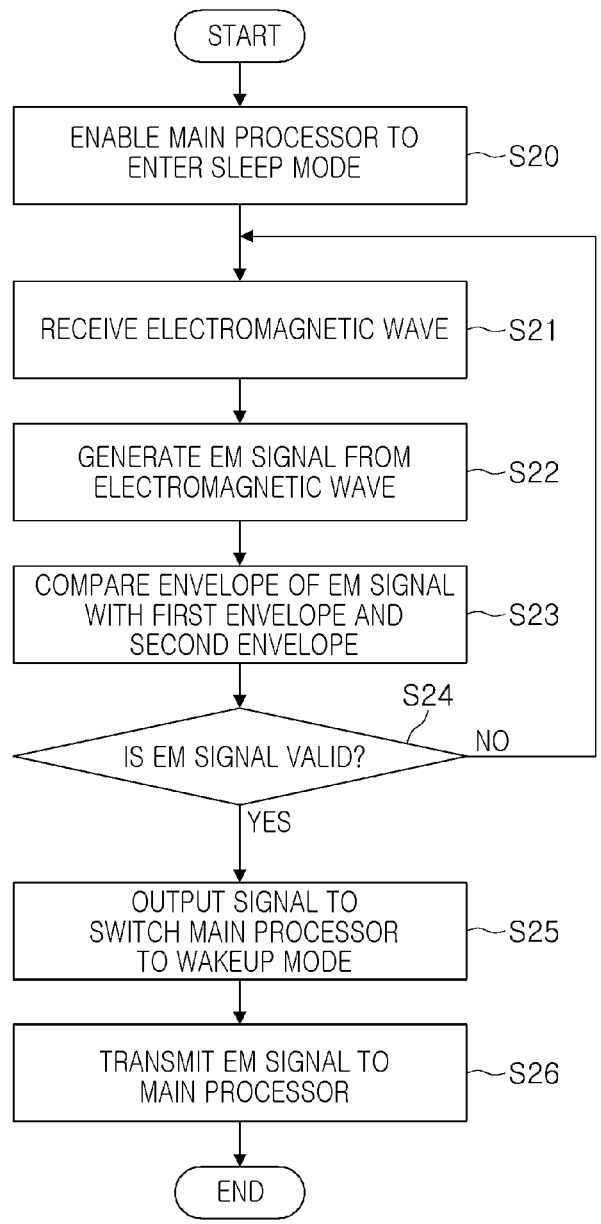
FIGS. 12 and 13 are flowcharts illustrating operations of EM sensors according to example embodiments of the present disclosure.
Figure 13:
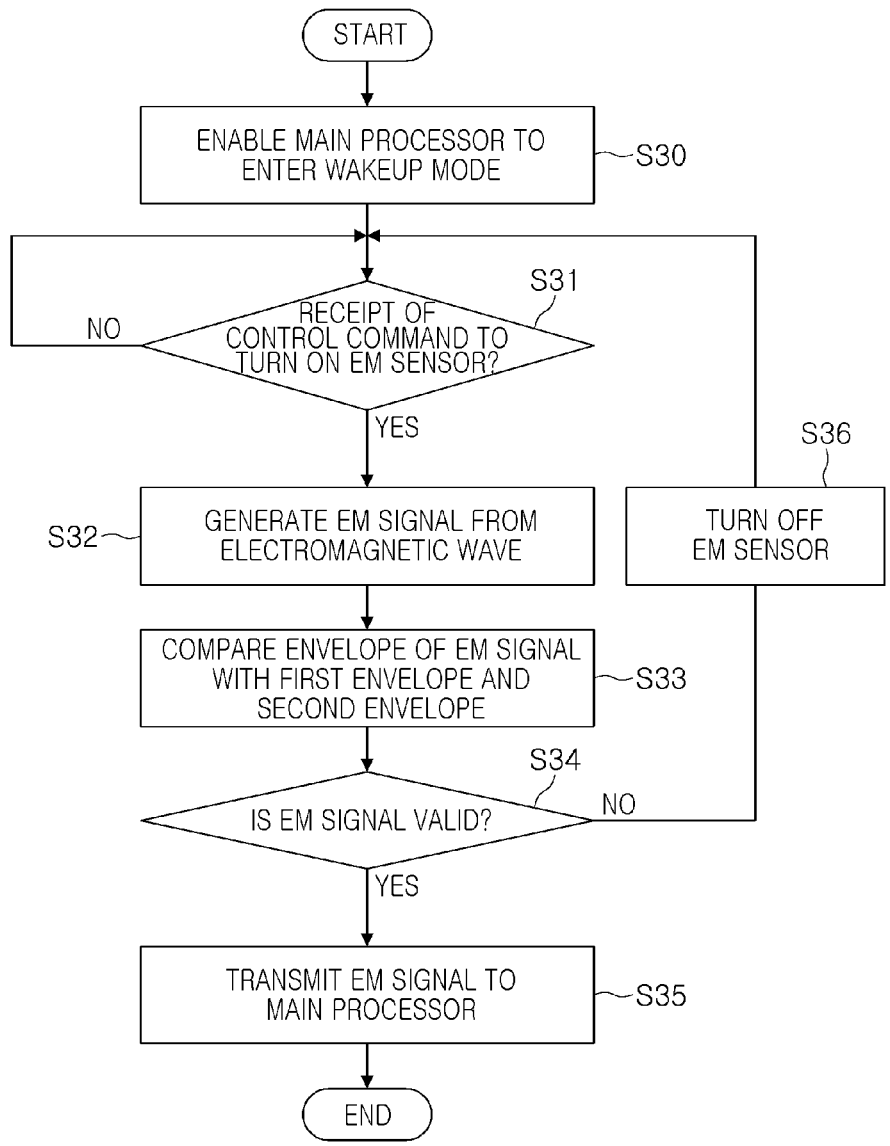

FIGS. 12 and 13 are flowcharts illustrating operations of an EM sensor according to an example embodiment.

Referring to FIG. 12, the operation of the EM sensor according to an example embodiment may start with a main processor entering a sleep mode in S20. The EM sensor may receive an electromagnetic wave even while the main processor enters the sleep mode in S21. The EM sensor may generate an electromagnetic signal from the electromagnetic wave in S22. In an example, the EM sensor may receive an electromagnetic wave every predetermined period. The EM sensor may generate an electromagnetic signal from each electromagnetic wave received every predetermined period.

A microcontroller unit of the EM sensor may compare an envelope of the electromagnetic signal with a first envelope of a first reference signal and a second envelope of a second reference signal in S23. As described above, the first reference signal and the second reference signal may be signals generated by a main processor in advance to be stored in an internal memory of the EM sensor. The main processor may generate a first reference signal by combining minimum values of multiple probability models to recognize an electronic device from which an electromagnetic wave was emitted. The main processor may generate a second reference signal by connecting maximum values of the probability models. Thus, in a frequency band in which the probability models are defined, the first envelope may be located to be lower than a position of the second envelope.

As described above with reference to FIGS. 8 to 11, the microcontroller unit may calculate the envelope ratio of the electromagnetic signal located between the first envelope and the second envelope, may compare the calculated envelope ratio with a predetermined threshold value, and may determine the validity of the electromagnetic signal in S24. For example, when the electromagnetic signal is determined to be an invalid signal in S24, the microcontroller unit may return to the operation of receiving the electromagnetic wave without entering the main processor into the wakeup mode.

When the electromagnetic signal is determined to be a valid signal in S24, the microcontroller unit may output a signal to switch the main processor to the wakeup mode in S25. In S25, the main processor may enter the wakeup mode by the signal output by the EM sensor. In addition, the EM sensor may transmit the electromagnetic signal and/or feature values of the electromagnetic signal to the main processor in S26. In S26, when the EM sensor only transmits the electromagnetic signal to the main processor, the main processor may extract the feature values of the electromagnetic signal to apply the extracted feature values to multiple probability models, thereby recognizing the electronic device from which the electromagnetic wave was emitted. In S26, when the EM sensor directly extracts feature values of the electromagnetic signal and transmits the extracted feature values to the main processor, the main processor may apply the feature values received from the EM sensor to the probability models, thereby recognizing the electronic device from which the electromagnetic wave was emitted.

In an example embodiment, while the main processor enters the sleep mode, the EM sensor may verify the validity of the electromagnetic signal, and may then switch the main processor to the wakeup mode, only for a valid electromagnetic signal. For example, for an invalid electromagnetic signal, the main processor may maintain the sleep mode, and may not perform an arithmetic operation for recognizing the electronic device. Thus, the consumed power and calculation burden of the main processor may be reduced.

Next, in an example embodiment illustrated in FIG. 13, the operation of the EM sensor may be started in a state in which the main processor entered the wakeup mode, in S30. An operation of recognizing the electronic device, using the EM sensor, may be executed in a state in which the main processor was out of the sleep mode and has entered the wakeup mode, according to an operation environment of a mobile device, the intention of a user or the like.

The main processor that has entered the wakeup mode may determine whether a control command to turn on the EM sensor is received in S31. For example, when the control command to turn on the EM sensor is not received in S31, the main processor may continuously check whether a control command for the EM sensor is received.

When the control command to turn on the EM sensor is received in S31, the EM sensor may be turned on in response to the control command. The EM sensor may generate an electromagnetic signal, using an externally introduced electromagnetic wave, in S32. The EM sensor may compare an envelope of the electromagnetic signal with a first envelope and a second envelope in S33. As described above, the first envelope may be an envelope of a first reference signal, and the second envelope may be an envelope of a second reference signal. The first reference signal may be a signal generated by combining minimum values of multiple probability models, and the second reference signal may be a signal generated by combining maximum values of the probability models. The main processor may receive the probability models from an external server to store the received probability models in a storage of a mobile device.

The EM sensor may determine whether the electromagnetic signal is valid, by calculating a ratio of a section in an envelope of the electromagnetic signal, greater than the first envelope and smaller than the second envelope, in S34. As an example, the EM sensor may determine that the electromagnetic signal is valid when the ratio of an envelope of the electromagnetic signal, greater than the first envelope and smaller than the second envelope, is greater than a predetermined threshold value.

When the electromagnetic signal is determined to be valid in S34, the EM sensor may transmit the electromagnetic signal and/or feature values acquired from the electromagnetic signal to the main processor in S35. Since the main processor has already entered the wakeup mode and is operating, the operation of generating a separate wakeup signal by the EM sensor and providing the wakeup signal to the main processor may be omitted. On the other hand, when it is determined in S34 that the electromagnetic signal is invalid, the EM sensor may be turned off again in S36. Resultingly, the EM sensor may return to an operation of waiting for a control command to turn on the EM sensor.

Figure 14:
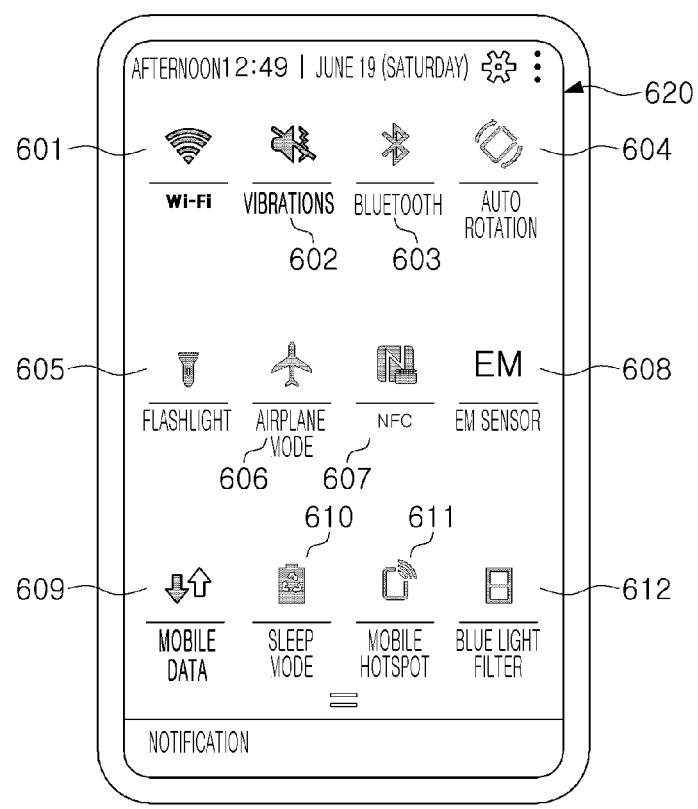
FIGS. 14 and 15 are diagrams illustrating operations of mobile devices according to example embodiments of the present disclosure.
Figure 15:
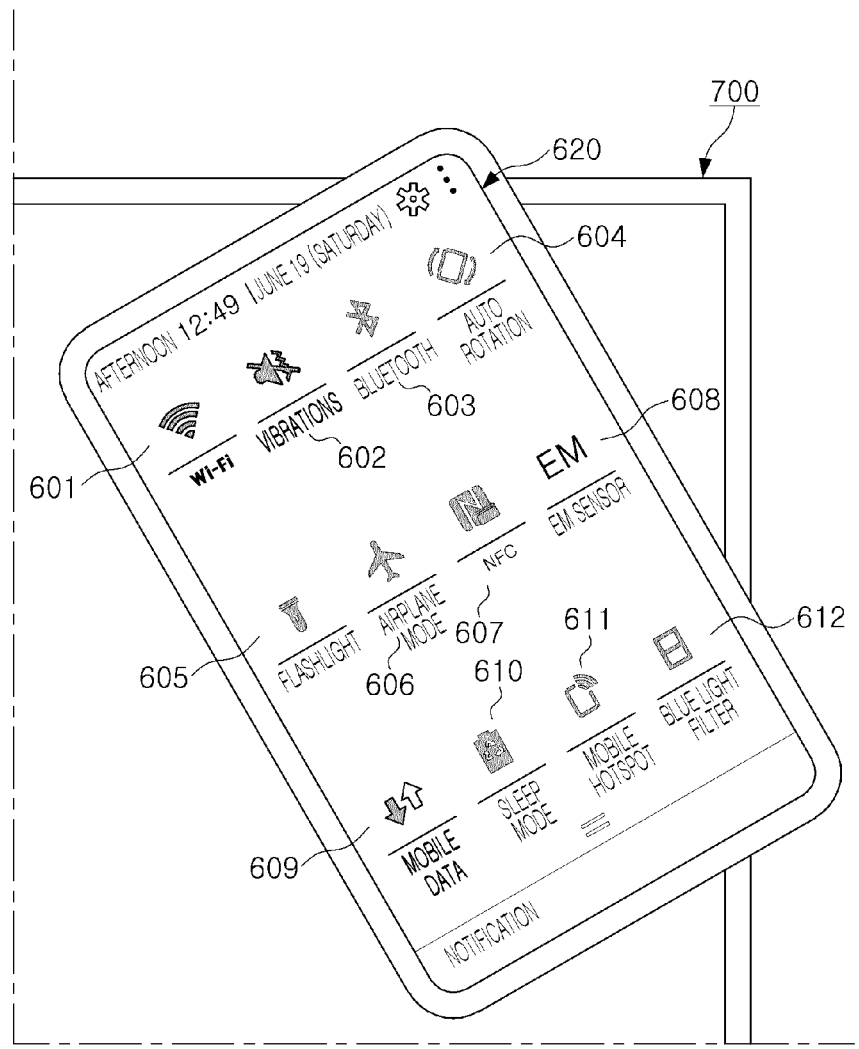

FIGS. 14 and 15 are diagrams illustrating operations of a mobile device according to an example embodiment.

Referring to FIG. 14, a mobile device 600 according to an example embodiment may display a control window on a display 620 to selectively control various sensors, communication modules and the like. For example, multiple control icons including icons for the Wi-Fi module 601 to icons for the Blue Light Filter 612 may be displayed in the control window. A user may selectively touch various control icons for the Wi-Fi module 601 to the Blue Light Filter 612 to selectively turn various sensors and communication modules on/off. In the example embodiment illustrated in FIG. 14, a Wi-Fi module 601, a vibration alarm module 602, and a mobile communication module 609 capable of exchanging data with a mobile network may only be turned on. In the example embodiment of FIG. 14, an EM sensor 608 may be in a turned-off state.

Next, referring to FIG. 15, the mobile device 600 may contact and/or approach another electronic device 700 in a state in which the EM sensor 608 is turned on by a user's operation. The EM sensor 608 that is turned on may convert an electromagnetic wave emitted from the electronic device 700 into an electromagnetic signal, and may verify the validity of the electromagnetic signal. When the electromagnetic signal is verified as a valid signal, the EM sensor 608 may transmit the electromagnetic signal to a main processor of the mobile device 600. Alternatively, the EM sensor 608 may extract feature values of the electromagnetic signal to transmit the extracted feature values to the main processor. The EM sensor 608 may not transmit a separate wakeup signal to the main processor, since the main processor may already operate in a wakeup mode to perform an operation of displaying a control window capable of turning on the EM sensor 608 on the display 620.

Figure 16:
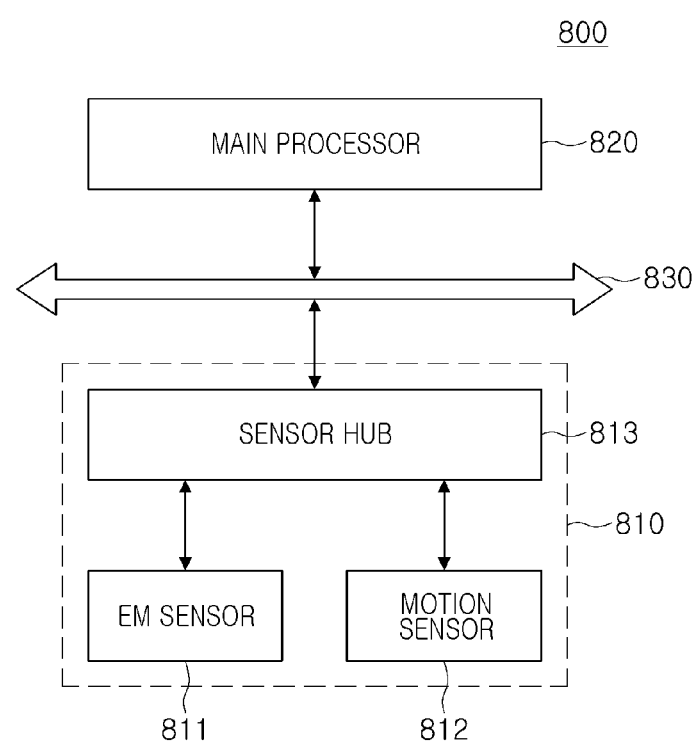
FIG. 16 is a schematic block diagram illustrating a mobile device according to an example embodiment of the present disclosure.

FIG. 16 is a schematic block diagram illustrating a mobile device according to an example embodiment.

Referring to FIG. 16, a mobile device 800 according to an example embodiment may include a sensor unit 810 and a main processor 820. The sensor unit 810 and the main processor 820 may exchange data with each other through a system bus 830 (data bus).

The sensor unit 810 may include an EM sensor 811, a motion sensor 812, and a sensor hub 813. The sensor unit 810 may further include various sensors such as an acceleration sensor, an illuminance sensor, a gravitational sensor and the like. Various sensors, for example, the EM sensor 811 and the motion sensor 812 included in the sensor unit 810, may exchange data directly through the sensor hub 813. For example, since various sensors may exchange data through the sensor hub 813 without going through the system bus 830, data may be exchanged between the sensors without the intervention of the main processor 820. For example, the EM sensor 811 and the motion sensor 812 may exchange data through the sensor hub 813 without going through the system bus 830. Data may be exchanged between the EM sensor 811 and the motion sensor 812 without the intervention of the main processor 820.

In the example embodiment illustrated in FIG. 16, information regarding a motion of the mobile device 800, collected by the motion sensor 812, may be utilized for an accurate operation of the EM sensor 811. For example, data generated by the motion sensor 812, with respect to a movement of the mobile device 800 contacting and/or approaching an electronic device emitting electromagnetic waves through a prior procedure, may be registered in advance. For example, when an electromagnetic signal is generated as electromagnetic waves are being introduced externally, the EM sensor 811 may receive a subsignal from the motion sensor 812 through the sensor hub 813. The subsignal may include information on whether the movement of the mobile device 800 sensed by the motion sensor 812 is a movement of contacting and/or approaching the mobile device 800 with the electronic device emitting electromagnetic waves. The EM sensor 811 may determine validity of the electromagnetic signal by comparing an envelope of the electromagnetic signal with envelopes of a first reference signal and a second reference signal. The EM sensor may also determine whether a movement of approaching and/or contacting the mobile device 800 with the electronic device has been generated, from the subsignal received from the motion sensor 812.

For example, the EM sensor 811 may transmit the electromagnetic signal and/or feature values of the electromagnetic signal to the main processor 820 via the system bus 830, only when the electromagnetic signal is determined to be valid and a motion of approaching and/or contacting the mobile device 800 with an electronic device has occurred. In this case, whether or not a user intends to actually recognize the electronic device may be inferred, based on the movement of the mobile device 800 and the validity of the electromagnetic signal sensed by the EM sensor 811. As a result, the operation accuracy of the EM sensor 811 may be improved, and the computation burden and power consumption of the main processor 820 may be efficiently managed.

FIGS. 17 to 20 are diagrams illustrating services using a mobile device according to an example embodiment.

Figure 17:
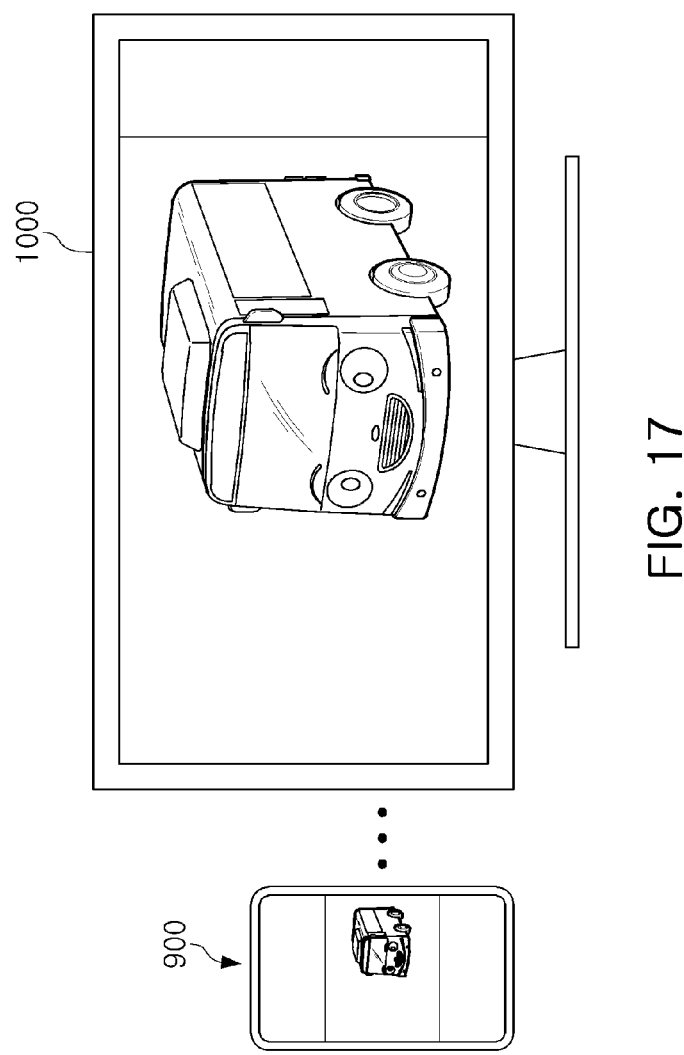
FIGS. 17 to 20 are diagrams illustrating services using a mobile device according to an example embodiment of the present disclosure.

Referring to FIG. 17, as a mobile device 900 contacts and/or approaches a television 1000, an EM sensor of the mobile device 900 may recognize a manufacturer, a model, an identification number and the like of the television 1000, using electromagnetic waves emitted from the television 1000. When the mobile device 900 approaches the television 1000, the EM sensor of the mobile device 900 may operate in an always-on manner of always being turned on or may be turned-on forcibly by a user.

When the mobile device 900 succeeds in recognizing the television 1000, after passing through the procedure of authenticating each other using account information respectively given to the television 1000 and the mobile device 900, various services may be provided. For example, as illustrated in FIG. 17, the television 1000 may receive and reproduce a URL address of a video being reproduced in the mobile device 900, or the like. Additionally, or alternatively, information regarding power consumed by the television 1000 for a predetermined period of time, or the like, may also be displayed on the mobile device 900. Alternatively, the mobile device 900 may take identification information of the television 1000, to use the identification information of the television 1000 to set up an Internet-of-Things (IoT) environment.

Figure 18:
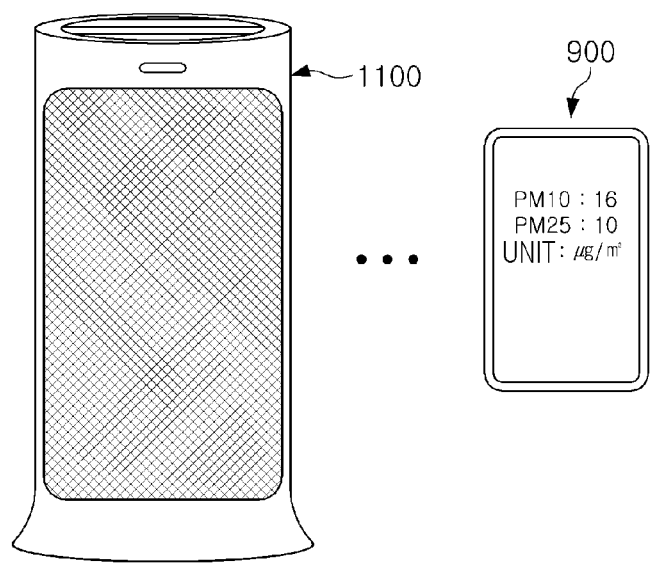

In an example embodiment illustrated in FIG. 18, the mobile device 900 may recognize an air cleaner 1100 (air purifier), using electromagnetic waves emitted by the air cleaner 1100. The mobile device 900 may display fine dust and ultrafine dust values detected by a dust sensor built in the air cleaner 1100, on a display. Alternatively, similarly to the example embodiment illustrated in FIG. 17, identification information of the air cleaner 1100 may be retrieved and used to set the IoT environment, or to notify a filter replacement period of the air cleaner 1100.

Figure 19:
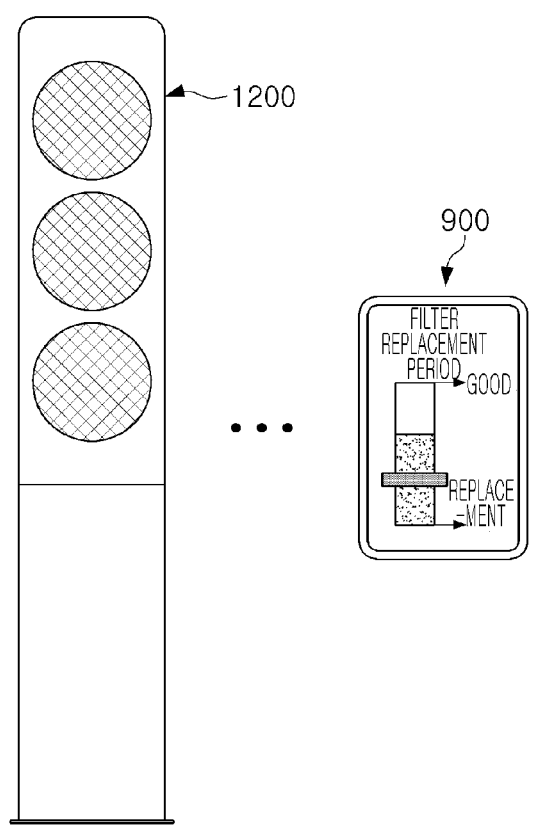

Referring to FIG. 19, the mobile device 900 may recognize an air conditioner 1200, using electromagnetic waves emitted from the air conditioner 1200. The mobile device 900 may indicate a replacement period or a cleaning period of a filter included in the air conditioner 1200. Alternatively, the mobile device 900 may display power consumption of the air conditioner 1200, or the like.

Figure 20:
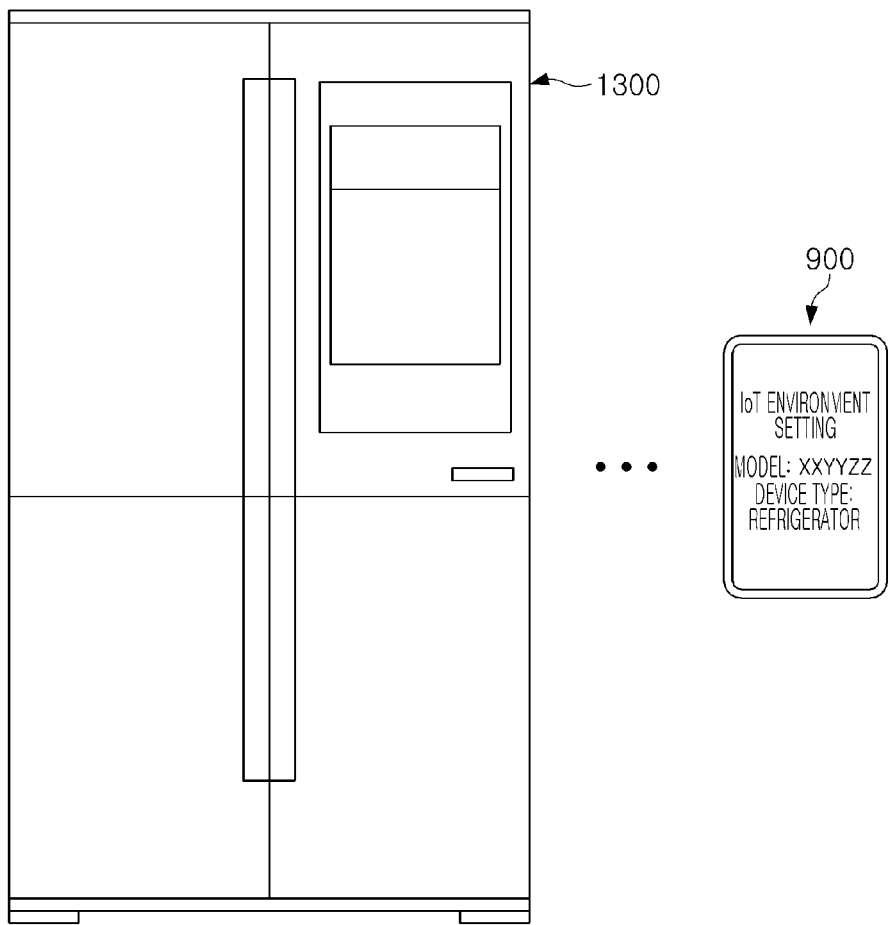

Referring to FIG. 20, an electronic device recognized by the mobile device 900, using electromagnetic waves, may be a refrigerator 1300. When the EM sensor of the mobile device 900 converts an electromagnetic wave into an electromagnetic signal and a main processor recognizes the refrigerator 1300 (electronic device) using feature values of the electromagnetic signal, the mobile device 900 may read the identification information of the refrigerator 1300 (electronic device) or the like, to run applications required to establish the IoT environment. The main processor may execute a service application suitable for the refrigerator 1300 (electronic device) when the refrigerator 1300 (electronic device) is successfully recognized. The main processor may execute the service application suitable for the refrigerator 1300 (electronic device) when a user account stored in an internal memory of the EM sensor of the mobile device 900 and/or the storage of the mobile device 900 coincides with a user account registered in the refrigerator 1300 (electronic device).

As set forth above, according to an example embodiment, an EM sensor may receive an electromagnetic wave to generate an electromagnetic signal, and may compare the electromagnetic signal with reference signals stored in a memory inside the EM sensor, to determine whether the electromagnetic signal is a valid signal. In addition, by transmitting the electromagnetic signal and/or feature values of the electromagnetic signal to a main processor only when the electromagnetic signal is determined to be a valid signal, consumed power and/or calculation burden of the main processor may be reduced.

While example embodiments have been shown and described above, it will be apparent to those skilled in the art that modifications and variations could be made without departing from the scope of the inventive concept(s) described herein as defined by the appended claims.

What is claimed is:

1. An electromagnetic (EM) sensor, comprising:
   a front-end module configured to generate an electromagnetic signal, using electromagnetic waves introduced externally;
   a memory configured to store a first reference signal and a second reference signal, generated from a plurality of probability models required to recognize the electromagnetic signal; and
   a microcontroller unit configured to compare the electromagnetic signal with the first reference signal and the second reference signal, to determine whether the electromagnetic signal is a valid signal,
   wherein the plurality of probability models are defined in a frequency domain, the first reference signal comprises an envelope connecting minimum values of the plurality of probability models at a plurality of reference frequencies, and the second reference signal comprises an envelope connecting maximum values of the plurality of probability models at the plurality of reference frequencies.

2. The EM sensor of claim 1, wherein the microcontroller unit compares an envelope of the electromagnetic signal with the envelope of the first reference signal and the envelope of the second reference signal, to calculate a probability that the electromagnetic signal is a valid signal.

3. The EM sensor of claim 2, wherein the microcontroller unit calculates a probability that the electromagnetic signal is a valid signal, by calculating a ratio at which the envelope of the electromagnetic signal is located between the envelope of the first reference signal and the envelope of the second reference signal in a predetermined frequency band.

4. The EM sensor of claim 2, wherein the microcontroller unit calculates a ratio at which the envelope of the electromagnetic signal is located between the envelope of the first reference signal and the envelope of the second reference signal in each of a plurality of frequency bands, and determines whether the electromagnetic signal is a valid signal, using validity scores calculated in each of the plurality of frequency bands, based on the ratio.

5. The EM sensor of claim 4, wherein the microcontroller unit compares a sum of the validity scores or an average of the validity scores with a predetermined threshold value, to determine whether the electromagnetic signal is a valid signal.

6. The EM sensor of claim 1, wherein the microcontroller unit outputs a signal for an external main processor to enter a wakeup mode, when the electromagnetic signal is determined to be valid.

7. The EM sensor of claim 6, wherein the microcontroller unit outputs a signal for the external main processor to enter the wakeup mode, when the electromagnetic signal is determined to be valid and a subsignal securing validity of the electromagnetic signal is received from another sensor via a sensor hub.

8. The EM sensor of claim 6, wherein the microcontroller unit is always maintained in a state of being turned on, regardless of whether the external main processor enters the wakeup mode, and determines whether the electromagnetic signal is valid at every predetermined period.

9. The EM sensor of claim 1, wherein the microcontroller unit is turned on or off by a control command that is input externally, and determines whether the electromagnetic signal is a valid signal in a state when the microcontroller unit is turned on by the control command, and
the microcontroller unit is turned on by the control command, while an external main processor operates in a wakeup mode.

10. The EM sensor of claim 1, wherein the microcontroller unit selects the electromagnetic signal as a selected electromagnetic signal from a plurality of different electromagnetic signals to determine whether the selected electromagnetic signal is a valid signal, when the front-end module generates a plurality of different electromagnetic signals.

11. The EM sensor of claim 1, wherein the memory stores a portion of the plurality of probability models, and
when the electromagnetic signal is determined to be a valid signal, the microcontroller unit recognizes an electronic device from which the electromagnetic waves were emitted, using feature values extracted from the electromagnetic signal and the portion of the plurality of probability models stored in the memory.

12. An EM sensor, comprising:
a front-end module configured to generate an electromagnetic signal from an externally introduced electromagnetic wave;
a memory configured to store a first envelope and a second envelope generated from a plurality of probability models required to recognize the electromagnetic signal; and
a microcontroller unit configured to calculate a ratio of an envelope of the electromagnetic signal located between the first envelope and the first envelope in a frequency domain, and output a signal for an external main processor to enter a wakeup mode when the ratio is greater than a predetermined threshold value,
wherein the microcontroller unit defines a plurality of frequency bands in the frequency domain, and calculates the ratio of the envelope of the electromagnetic signal located between the first envelope and the first envelope in each of the plurality of frequency bands, to calculate validity scores, and outputs a signal for the external main processor to enter a wakeup mode, based on a sum or an average of the validity scores.

13. A mobile device, comprising:
an EM sensor configured to compare an envelope of an electromagnetic signal, corresponding to an electromagnetic wave introduced externally, with a first envelope and a second envelope, to determine whether the electromagnetic signal is a valid signal, and extract feature values of the electromagnetic signal when the electromagnetic signal is a valid signal;
a main processor configured to enter a wakeup mode in response to a signal from the EM sensor when the EM sensor determines that the electromagnetic signal is a valid signal, and recognize an electronic device from which the electromagnetic wave was emitted, using the feature values of the electromagnetic signal; and
a storage configured to store a plurality of probability models required to recognize the electronic device,
wherein the main processor generates the first envelope by connecting minimum values of the plurality of probability models at a plurality of reference frequencies, and generates the second envelope by connecting maximum values of the plurality of probability models at the plurality of reference frequencies, and stores the first envelope and the second envelope in an internal memory of the EM sensor, and
the main processor regenerates the first envelope as a regenerated first envelope and the second envelope as a regenerated second envelope and stores the regenerated first envelope and the regenerated second envelope in an internal memory of the EM sensor, when the plurality of probability models stored in the storage are updated.

14. The mobile device of claim 13, wherein the main processor receives the plurality of probability models from a server providing a cloud service, stores the plurality of probability models in the storage, and updates the plurality of probability models by being connected to the server in every predetermined period.

15. The mobile device of claim 13, wherein the plurality of probability models are Gaussian Mixture Models (GMMs).

16. The mobile device of claim 13, wherein the EM sensor comprises a front-end module generating the electromagnetic signal from the electromagnetic wave, and the front-end module sharing an antenna with another communication module.

17. The mobile device of claim 13, wherein the main processor executes a service application suitable for the electronic device when the electronic device is successfully recognized.

18. The mobile device of claim 17, wherein the main processor executes a service application suitable for the electronic device when a user account stored in at least one of an internal memory of the EM sensor and the storage coincides with a user account registered in the electronic device.

19. The mobile device of claim 13, wherein the main processor operates in a sleep mode while the EM sensor determines whether the electromagnetic signal is a valid signal, and enters the wakeup mode when the electromagnetic signal is determined to be a valid signal.

20. The mobile device of claim 17, wherein the main processor regenerates the first envelope as a regenerated first envelope and the second envelope as a regenerated second envelope and stores the regenerated first envelope and the regenerated second envelope in an internal memory of the EM sensor, when the plurality of probability models stored in the storage are updated.

* * * * *